(12) United States Patent
Wei et al.

(10) Patent No.: US 11,903,298 B2
(45) Date of Patent: Feb. 13, 2024

(54) DISPLAY PANEL AND DISPLAY DEVICE

(71) Applicant: BOE TECHNOLOGY GROUP CO., LTD., Beijing (CN)

(72) Inventors: Junbo Wei, Beijing (CN); Shengji Yang, Beijing (CN); Kuanta Huang, Beijing (CN); Pengcheng Lu, Beijing (CN); Yuanlan Tian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 535 days.

(21) Appl. No.: 17/259,373

(22) PCT Filed: Mar. 27, 2020

(86) PCT No.: PCT/CN2020/081860
§ 371 (c)(1),
(2) Date: Jan. 11, 2021

(87) PCT Pub. No.: WO2021/189487
PCT Pub. Date: Sep. 30, 2021

(65) Prior Publication Data
US 2022/0140020 A1    May 5, 2022

(51) Int. Cl.
*H01L 27/32*    (2006.01)
*H10K 59/88*    (2023.01)
(Continued)

(52) U.S. Cl.
CPC ............. *H10K 59/88* (2023.02); *H01L 22/30* (2013.01); *H01L 22/32* (2013.01); *H10K 50/88* (2023.02);
(Continued)

(58) Field of Classification Search
CPC ........ H10K 71/70; H10K 50/88; H01L 22/30; H01L 22/32
See application file for complete search history.

(56) References Cited

U.S. PATENT DOCUMENTS 8,174,179 B2    5/2012    Suh
9,691,782 B1    6/2017    Hwang et al.
(Continued)

FOREIGN PATENT DOCUMENTS

CN    107204335 A    9/2017
CN    107342291 A    11/2017
(Continued)

OTHER PUBLICATIONS

Extended European Search Report for EP Patent Application No. 20900695.6 dated Apr. 26, 2023.
(Continued)

*Primary Examiner* — Victoria K. Hall
(74) *Attorney, Agent, or Firm* — Perilla Knox & Hildebrandt LLP; Kenneth A. Knox

(57) ABSTRACT

A display panel includes a driving backplane, a plurality of detection pads, a light emitting function layer, and a flexible circuit board. The driving backplane has a pixel driving region and a peripheral region, and the peripheral region has bonding pads; an edge of the driving backplane is surrounded by a first section and a second section, and the bonding pads are located between the first section and the pixel driving region; a plurality of detection pads are disposed in and distributed along the second section; a light emitting function layer is disposed on the driving backplane and located in the pixel driving region; a flexible circuit board extends between the first section and the pixel driving region, and is bonded to the bonding pads; a first packaging layer is disposed on the light emitting function layer.

20 Claims, 7 Drawing Sheets

(51) Int. Cl.
    *H10K 59/131*     (2023.01)
    *H10K 71/70*     (2023.01)
    *H10K 59/80*     (2023.01)
    *H01L 21/66*     (2006.01)
    *H10K 50/88*     (2023.01)
    *H10K 77/10*     (2023.01)
    *H01L 23/00*     (2006.01)
    *H10K 71/00*     (2023.01)
    *H10K 102/00*     (2023.01)

(52) U.S. Cl.
    CPC ......... *H10K 59/131* (2023.02); *H10K 59/873* (2023.02); *H10K 71/70* (2023.02); *H10K 77/111* (2023.02); *H01L 24/05* (2013.01); *H01L 24/08* (2013.01); *H01L 2224/05556* (2013.01); *H01L 2224/05564* (2013.01); *H01L 2224/05573* (2013.01); *H01L 2224/08225* (2013.01); *H10K 59/8731* (2023.02); *H10K 71/851* (2023.02); *H10K 2102/351* (2023.02)

(56) References Cited

U.S. PATENT DOCUMENTS

| | | |
|---|---|---|
| 10,057,502 B2 | 8/2018 | Tamaki et al. |
| 2005/0236620 A1 | 10/2005 | Yamada |
| 2010/0007270 A1 | 1/2010 | Suh |
| 2017/0272662 A1 | 9/2017 | Tamaki et al. |
| 2018/0212011 A1 | 7/2018 | Lai et al. |
| 2019/0280074 A1* | 9/2019 | Li ................... H10K 50/82 |
| 2019/0348478 A1* | 11/2019 | Kim ................ G09G 3/006 |
| 2020/0212153 A1 | 7/2020 | Lai et al. |

FOREIGN PATENT DOCUMENTS

| | | |
|---|---|---|
| CN | 108400101 A | 8/2018 |
| CN | 108878687 A | 11/2018 |
| CN | 110473895 A | 11/2019 |
| CN | 108878687 B | 3/2020 |
| WO | 2017063568 A1 | 4/2017 |
| WO | 2019214590 A1 | 11/2019 |

OTHER PUBLICATIONS

Written Opinion for International Application No. PCT/CN2020/081860 dated Dec. 29, 2020.

* cited by examiner

DISPLAY PANEL AND DISPLAY DEVICE

CROSS-REFERENCE TO RELATED APPLICATIONS

The present application is based on and claims the priority to International Application No. PCT/CN2020/081860, filed on Mar. 27, 2020, which is incorporated herein by reference in its entirety.

TECHNICAL FIELD

The present disclosure relates to the field of display technology, and in particular, to a display panel and a display device.

BACKGROUND

Micro OLED displays involve the combination of organic light emitting diode (OLED) technology and CMOS technology, and relate to the cross-integration of the optoelectronic industry and the microelectronics industry, which has promoted the development of a new generation of micro display technology. It has also promoted the research and development of organic electronics on silicon and even molecular electronics on silicon.

Micro OLED displays have excellent display characteristics, such as high resolution, high brightness, rich colors, low drive voltage, fast response speed, and low power consumption, and have broad development prospects.

It should be noted that the information disclosed in the above described background only serves to enhance an understanding of the background of the present disclosure, which may include information that does not constitute prior art known to those skilled in the art.

BRIEF SUMMARY

According to an aspect of the present disclosure, a display panel is provided, including:

A driving backplane, having a pixel driving region and a peripheral region surrounding the pixel driving region, and the peripheral region being provided with bonding pads; an edge of the driving backplane being surrounded by a first section and a second section, and the bonding pads being located between the first section and the pixel driving region.

a plurality of detection pads, being disposed in the second section and distributed along the second section;

A light emitting function layer, being disposed on the driving backplane and located in the pixel driving region.

A flexible circuit board, extending between the first section and the pixel driving region, and being bonded to the bonding pads.

A first packaging layer, being disposed on a side of the light emitting function layer away from the driving backplane, and an orthographic projection of the first packaging layer on the driving backplane covering the pixel driving region and the detection pads.

In an exemplary embodiment of the present disclosure, the driving backplane has bonding holes exposing the bonding pads, and the flexible circuit board is bonded to the bonding pads through conductive material filled in the bonding holes.

In an exemplary embodiment of the present disclosure, the driving backplane includes:

A substrate.

A driving transistor, being disposed on one side of the substrate and located in the pixel driving region.

Multi-layer wiring layers, being sequentially spaced and distributed on a side of the driving transistor away from the substrate along a direction away from the substrate; at least one of the wiring layers is connected to the light emitting function layer, and each of a gate, a first pole, and a second pole of the driving transistor is connected to at least one of the wiring layers.

In an exemplary embodiment of the present disclosure, the wiring layers include a first wiring layer and a second wiring layer; the driving backplane further includes:

A first planarization layer, covering the driving transistor; the first wiring layer is disposed on a surface of the first planarization layer away from the substrate and connected to the driving transistor.

A second planarization layer, covering the first wiring layer; the second wiring layer is disposed on a side of the first planarization layer away from the substrate and connected to the first wiring layer.

A third planarization layer, covering the second wiring layer, and the light emitting function layer is disposed on a surface of the third planarization layer away from the substrate and connected to the second wiring layer.

The bonding pads and the first wiring layer are disposed in the same layer, and the bonding holes are configured to penetrate the third planarization layer and the second planarization layer.

In an exemplary embodiment of the present disclosure, the driving transistor includes:

An active layer, being disposed in the substrate, the first pole and the second pole are disposed in the active layer at intervals.

A gate insulating layer, being disposed on the active layer and exposing the first pole and the second pole.

The gate is disposed on a surface of the gate insulating layer away from the active layer; the first pole, the second pole and the gate are connected to the first wiring layer.

In an exemplary embodiment of the present disclosure, the light emitting function layer includes:

A first electrode, being disposed on the driving backplane; the detection pads and the first electrode are disposed in the same layer A light emitting material layer, being disposed on a side of the first electrode away from the driving backplane.

A second electrode, being disposed on a side of the light emitting material layer away from the driving backplane.

In an exemplary embodiment of the present disclosure, the flexible circuit board has a plurality of conductive contact pieces disposed side by side at intervals; numbers of the bonding pads and the bonding holes are the same and both are multiple, each of the bonding pads is exposed from each of the bonding holes in a one-to-one correspondence, and each of the conductive contact pieces covers each of the bonding holes in a one-to-one correspondence, and is connected to the bonding pads through a conductive material.

In an exemplary embodiment of the present disclosure, an area of a region of the conductive contact pieces for connecting with the bonding pads is not less than 80% of an area of the conductive contact pieces.

In an exemplary embodiment of the present disclosure, the driving backplane is in a shape of rectangle, the first section is one side of the rectangle, and the second section includes other sides of the rectangle.

In an exemplary embodiment of the present disclosure, edges of the driving backplane include opposite first short side and second short side and opposite first long side and second long side, the first section is the first short side, and the second section includes a second short side, a first long side, and a second long side; the second short side, the first long side and the second long side are all provided with a same number of detection pads.

In an exemplary embodiment of the present disclosure, an aperture of the bonding holes gradually decreases toward the bonding pads.

In an exemplary embodiment of the present disclosure, a slope of a sidewall of the bonding holes with respect to the bonding pads is not less than 40° and not more than 70°.

In an exemplary embodiment of the present disclosure, the display panel further includes:

A color film layer, being disposed on a side of the first packaging layer away from the driving backplane and corresponding to the pixel driving region.

A second packaging layer, being disposed on a side of the color film layer away from the driving backplane, and an orthographic projection of the second packaging layer on the driving backplane covers the pixel driving region, the peripheral region, and the detection pads.

A transparent cover plate, covering at least the second packaging layer and corresponding to the pixel driving region.

In an exemplary embodiment of the present disclosure, the first packaging layer and the second packaging layer are sequentially laminated on surfaces of the detection pads away from the driving backplane in regions corresponding to the detection pads.

In an exemplary embodiment of the present disclosure, a projection of the color film layer on the driving backplane is located in the pixel driving region, and a distance between the color film layer and the detection pads in a direction parallel to the driving backplane is 150 μm to 200 μm.

According to an aspect of the present disclosure, there is provided a display device including the display panel described in any one of the above.

It should be understood that the above general description and the following detailed description are only exemplary and explanatory, and cannot limit the present disclosure.

BRIEF DESCRIPTION OF THE DRAWINGS

The accompanying drawings herein are incorporated into the specification and form a part of the present specification. The embodiments conforming to the present disclosure are shown and used to explain the principles of the present disclosure in conjunction with the specification. Understandably, the accompanying drawings described below are only some embodiments of the present disclosure, and other accompanying drawings can be obtained from these accompanying drawings without any creative effort for those skilled in the art.

DETAILED DESCRIPTION

Figure 1:
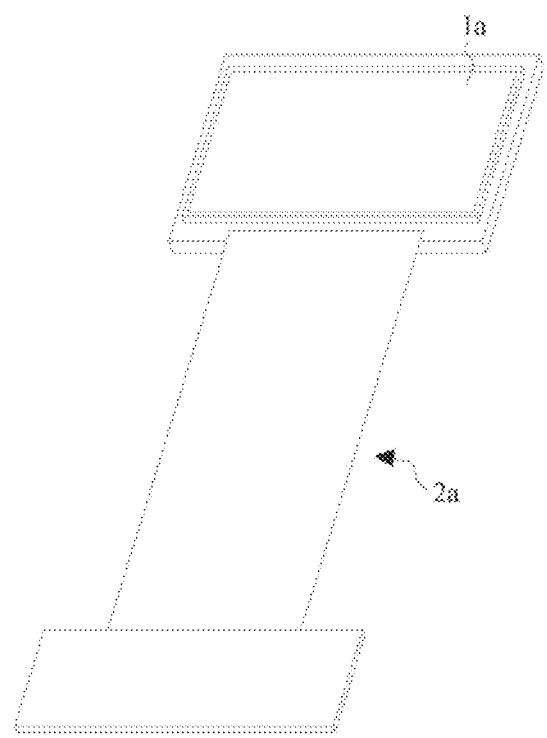
FIG. 1 is a schematic diagram of a display panel in the related art.

Now, exemplary embodiments will be described more comprehensive with reference to the accompanying drawings. However, exemplary embodiments can be implemented via various manners, and should not be understood as being limited to the embodiments set forth herein. Conversely, these embodiments are provided so that the present disclosure will be comprehensive and complete, and the concept of the example embodiments will be comprehensively communicated to those skilled in the art. The same reference numeral in the accompanying figures denotes the same or similar structure(s), thereby detailed description thereof will be omitted. Furthermore, the accompanying drawings are only exemplary illustrate of the present disclosure and are not necessarily to scale.

Although relative terms such as "on" and "below" are used in this specification to describe the relative relationship between one component of a reference numeral and another component, these terms are used in this specification only for convenience, for example according to the direction of the example described in the accompanying drawings. It should be understood that if the device of a reference numeral is flipped upside down, the component described "on" will become the component "below". When a certain structure is "on" the other structure, it may refer to that the certain structure is formed on the other structure, or that the certain structure is "directly" disposed on the other structure, or that the certain structure is "indirectly" disposed on the other structure via another structure.

The terms "one", "a/an", "this", and "the" are used to denote the existence of one or more elements/components/etc.; the terms "include/comprise" and "have" are used to denote the meaning of open inclusion and refer to the existence of additional elements/components/etc. in addition to the listed elements/components/etc. The terms "first", "second" and "third" are used only as tags, and not as a limitation on the number of objects.

In the related art, the display panel may include a driving backplane, a light emitting device disposed on the driving backplane, a packaging layer, and a color film layer for packaging the light emitting device. Among them, as shown in FIG. 1, the driving backplane 1a can be bonded to the flexible circuit board 2a, that is, the conductive contact pieces of the flexible circuit board 2a are bound with the bonding pads of the driving backplane 1a, so that the light emitting device is driven to emit light through the driving backplane 1a.

Since the uniformity of the thickness of each film layer directly affects the performance of the display panel, in order to facilitate the detection of the uniformity of the film layer thickness, there are often multiple conductive detection pads that are provided on the edge of the driving backplane. For a film layer that needs to be tested for film thickness uniformity, such as a packaging layer or other film layers, the thickness of the film layer on each detection pad is detected by a film thickness tester, and the uniformity of the film layer can be determined by comparison. However, because the detection pads are distributed on the edge of the driving backplane, when the flexible circuit board is bonded, the conductive contact pieces of the flexible circuit board not only contact the bonding pad, but may also contact the detection pad, which may easily cause a short circuit and cause abnormal display.

The embodiment of the present disclosure provides a display panel, the display panel may be an OLED display panel, as shown in FIGS. 2-6, the display panel of the embodiment of the present disclosure includes a driving backplane 1, detection pads 2, a light emitting function layer 3, a flexible circuit board 4, and a first packaging layer 5:

Where, the driving backplane 1 has a pixel driving region S1 and a peripheral region S2 surrounding the pixel driving region S1, and the peripheral region S2 has bonding pads 6; the edge of the driving backplane 1 is surrounded by the first section 11 and the second section 12, and the bonding pads 6 are located between the first section 11 and the pixel driving region S1.

A plurality of detection pads 2 are disposed in the second section 12 and distributed along the second section 12.

The light emitting function layer 3 is disposed on the driving backplane 1 and located in the pixel driving region S1.

The flexible circuit board 4 extends between the first section 11 and the pixel driving region S1, and is bonded to the bonding pads 6;

The first packaging layer 5 is disposed on the side of the light emitting function layer 3 away from the driving backplane 1, and the orthographic projection of the first packaging layer 5 on the driving backplane 1 covers the pixel driving region S1 and the detection pads 2.

The display panel of the embodiment of the present disclosure, the flexible circuit board 4 is attached to the region of the driving backplane 1 between the first section 11 and the pixel driving region S1, and covers the bonding hole 100, so that the flexible circuit board 4 can be bonded to the bonding pads 6. Since the detection pads 2 are disposed in the second section 12 on the edge of the driving backplane 1, and not in the first section 11, the bonding pads 6 are located between the first section 11 and the pixel driving region S1, which can prevent the flexible circuit board 4 from contacting the detection pads 2, thereby preventing short circuits and ensuring normal display.

Each part of the display panel of the embodiment of the present disclosure will be described in detail below.

Figure 2:
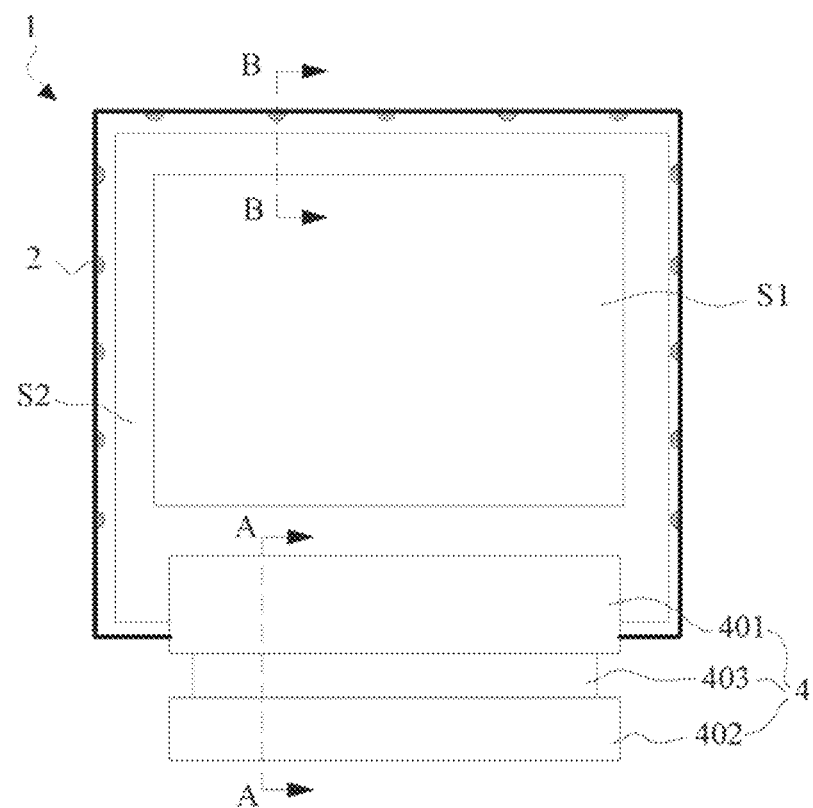
FIG. 2 is a top view of an embodiment of the display panel of the present disclosure.
Figure 3:
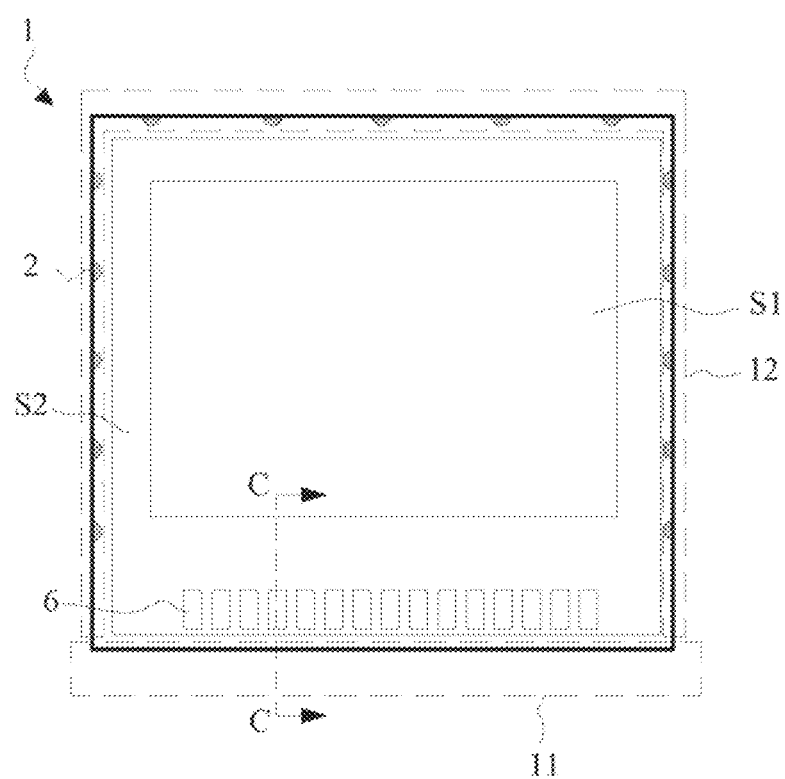
FIG. 3 is a top view in an embodiment of the display panel of the present disclosure which is not bonded to a flexible circuit board.

As shown in FIG. 2 and FIG. 3, the pixel driving region S1 of the driving backplane 1 has a pixel driving circuit for driving the light emitting function layer 3 to emit light, the pixel driving circuit may include conventional 2T1C (that is, two transistors and one capacitor) pixel circuit, 4T2C, 5T1C, 7T1C etc. pixel driving circuits. The specific circuit structure and driving mode are not specifically limited here. The peripheral region S2 may have peripheral circuits such as a data driving circuit, a gate driving circuit, and a light emitting control circuit etc. for outputting signals to the pixel driving circuit. The specific circuit structure and driving mode are not specifically limited here.

Figure 4:
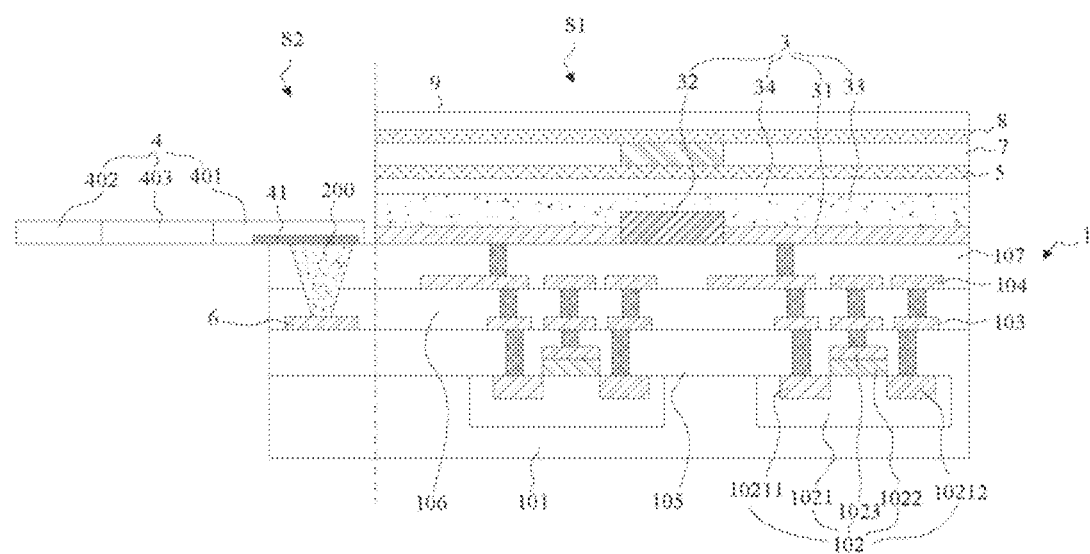
FIG. 4 is an A-A cross-sectional view of an embodiment of the display panel in FIG. 2.
Figure 5:
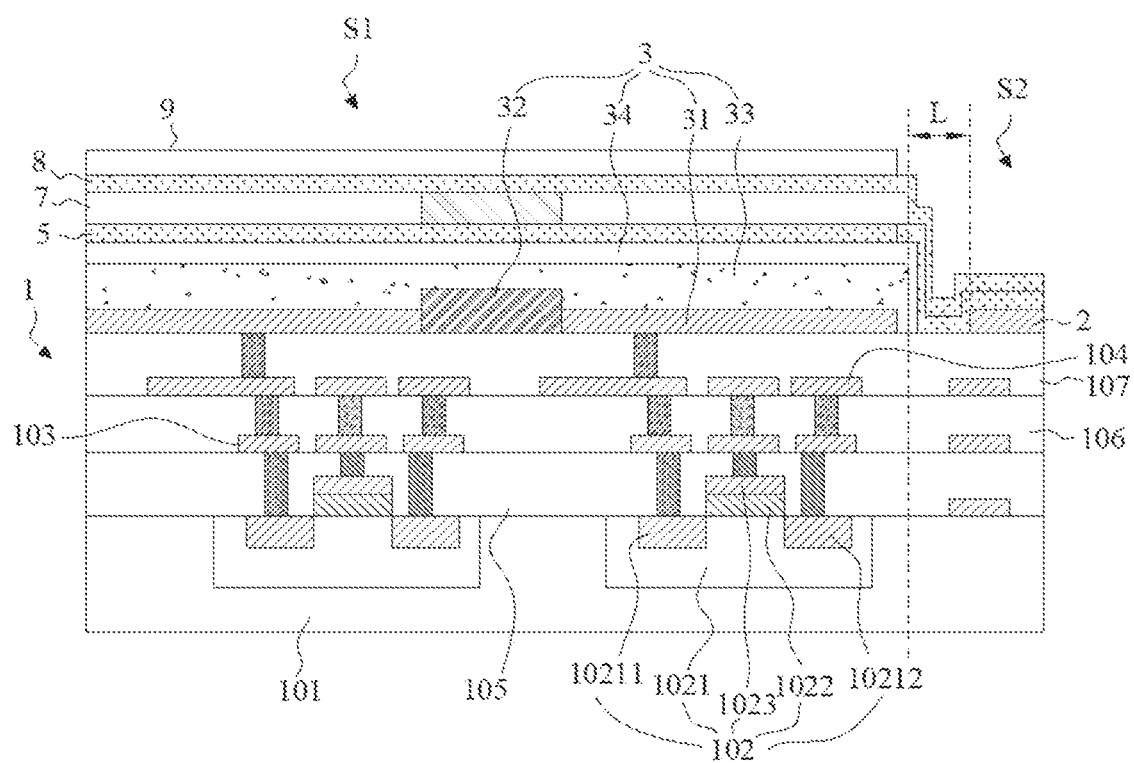
FIG. 5 is a B-B cross-sectional view of an embodiment of the display panel in FIG. 2.
Figure 6:
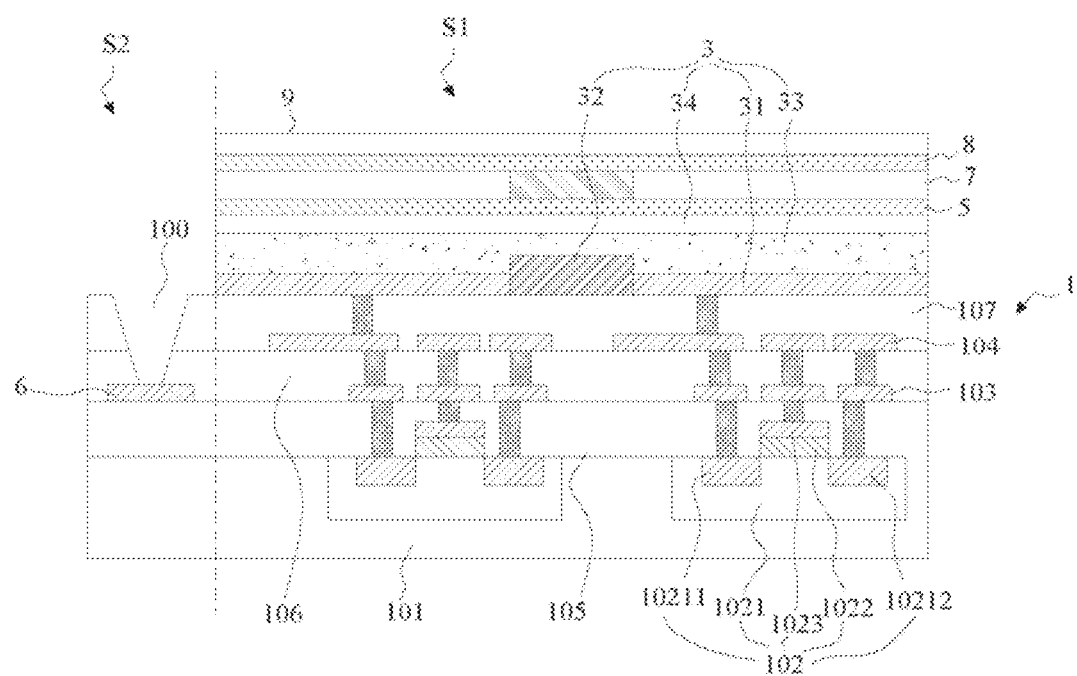
FIG. 6 is a C-C cross-sectional view of an embodiment of the display panel in FIG. 3.

As shown in FIGS. 4-6, the driving backplane 1 may include a substrate 101, a driving transistor 102, and a multilayer wiring layer. Among them, the driving transistor 102 may be located in the pixel driving region S1, and it may be a transistor connected to the light emitting function layer 3 in the pixel driving circuit. The driving transistor 102 may include a gate, a first pole (source electrode), and a second pole (drain electrode).

Each wiring layer may be disposed on one side of the substrate 101 and is sequentially spaced apart along the direction away from the substrate 101, and two adjacent wiring layers may be separated by a planarization layer made from insulating material. At least one of the wiring layers is connected to the light emitting function layer 3, at least one of the wiring layers is connected (electrically connected) to the driving transistor 102, for example, the gate, the first pole, and the second pole of the driving transistor 102 are all connected to the same wiring layer. However, the light emitting function layer 3 and the driving transistor 102 may be connected to different wiring layers. The region of the wiring layer located in the pixel driving region S1 can be used to realize layered wiring, and can form a pixel driving circuit through cross-layer connection.

For the embodiment in which the driving backplane 1 is a silicon-based driving backplane, at least one of the wiring layers is made from light-reflecting material to ensure that the light emitted by the light emitting function layer 3 is emitted in a direction away from the driving backplane 1.

In some embodiments of the present disclosure, as shown in FIGS. 4 to 6, the driving backplane 1 may be a silicon-based driving backplane. Specifically, the substrate 101 may be a silicon base, and its material may be single crystal silicon or the like.

The driving transistor 102 may include an active layer 1021, a gate insulating layer 1022, and a gate 1023. Among them, the active layer 1021 may be formed in the substrate 101 through a doping process, and includes spaced first pole 10211 and second pole 10212. The gate insulating layer 1022 is disposed on the active layer 1021 and exposes the first pole 10211 and the second pole 10212. The gate 1023 is disposed on the surface of the gate insulating layer 1022 away from the active layer 1021.

The wiring layer may include a first wiring layer 103 and a second wiring layer 104. Among them, the first wiring layer 103 is connected to the first pole 10211, the second pole 10212, and the gate 1023 through via holes, the via holes are tungsten holes or other metallized holes. The second wiring layer 104 is disposed on the side of the first wiring layer 103 away from the substrate 101 and is connected (electrically connected) to the light emitting function layer 3, and the second wiring layer 104 is made from light-reflecting material.

In some embodiments of the present disclosure, at least one of the gate 1023 and at least one of the wiring layers (the first wiring layer 103 and the second wiring layer 104) has an area located in the peripheral region S2, so as to form a peripheral driving circuit, for example, a light emitting control circuit, a gate drive circuit, etc.

Further, the driving backplane 1 further includes a first planarization layer 105, a second planarization layer 106, and a third planarization layer 107.

The first planarization layer 105 covers the driving transistor 102, that is, the area of the substrate 101 located outside the gate 1023. The first wiring layer 103 is disposed on the surface of the first planarization layer 105 away from the substrate 101 and is connected to the driving transistor 102 through a via hole penetrating the first planarization layer 105.

The second planarization layer 106 covers the first wiring layer 103 and covers the area of the first planarization layer 105 outside the first wiring layer 103; The second wiring layer 104 is disposed on a side of the second planarization layer 106 away from the substrate 101 and is connected to the first wiring layer 103 through via holes.

The third planarization layer 107 covers the second wiring layer 104 and covers the area where the second planarization layer 106 is located outside the second wiring layer 104. The light emitting function layer 3 may be disposed on the surface of the third planarization layer 107 away from the substrate 101 and connected to the second wiring layer 104 through via holes.

The bonding pads 6 and the first wiring layer 103 are disposed in the same layer, and the bonding hole 100 penetrates the third planarization layer 107 and the second planarization layer 106.

The peripheral region S2 has bonding pads 6 that can be bonded to the flexible circuit board 4 and connected to the circuit of the peripheral region S2 so that signals can be input through the flexible circuit board 4. There are a plurality of bonding pads 6, which can be disposed side by side in the bonding region of the peripheral region S2 at intervals.

The materials of the first planarization layer 105, the second planarization layer 106, and the third planarization layer 107 may include silicon nitride, silicon oxide or other insulating materials, which are not specifically limited herein.

As shown in FIG. 3, the edge of the driving backplane 1 can be enclosed by the first section 11 and the second section 12. The shapes of the first section 11 and the second section 12 are not particularly limited here, as long as they can be enclosed in a closed figure. For example, the driving backplane 1 is in a shape of a rectangle. The first section 11 is one side of the rectangle, and the second section 12 includes the other sides of the rectangle. Further, the edges of the driving backplane 1 include opposite first and second short sides and opposite first and second long sides. The first section 11 can be any one of the first short side, the second short side, the first long side, and the second long side, and the second section 12 is formed by connecting other sides, for example, the first section 11 is a first short side, and the second section 12 includes a second short side, a first long side, and a second long side.

The bonding pads 6 are located between the first section 11 and the pixel driving region S1. For example, the bonding pads 6 are located between the first short side and the pixel driving region S1.

In some embodiments of the present disclosure, as shown in FIGS. 4 and 6, the bonding pads 6 may be located inside the driving backplane 1. In addition, the driving backplane 1 is disposed with a bonding hole 100 exposing the bonding pads 6, and the flexible circuit board 4 can cover the bonding hole 100 and be connected to the bonding pads 6 through a conductive material 200. Further, the bonding pads 6 are disposed in the same layer with one of the above-mentioned wiring layers. For example, the bonding pads 6 may be disposed in the same layer with the first wiring layer 103, so that they can be formed at the same time through the same patterning process.

Further, the aperture of the bonding hole 100 gradually decreases toward the bonding pads 6 so that the cross section of the bonding hole 100 along the direction perpendicular to the driving backplane 1 is in a shape of an inverted trapezoid.

In addition, the slope of the sidewall of the bonding hole 100 with respect to the bonding pad 6, that is, the angle between the section of the bonding hole 100 in the direction perpendicular to the driving backplane 1 and the surface of the bonding pad 6 is not less than 40° and not more than 70°, such as 40°, 50°, 60°, or 70°.

Of course, in other embodiments of the present disclosure, the bonding pads 6 may also be located on the surface of the driving backplane 1, for example, on the surface of the third planarization layer 107 away from the substrate 101, the flexible circuit board 4 can be directly connected to the bonding pad 6 and bonded to the bonding pad 6.

As shown in FIGS. 2 and 5, the detection pads 2 can be made of conductive material, and their material can include copper, copper alloy, etc. with good conductivity. At the same time, there are a plurality of detection pads 2, for example, the number of the detection pads are 24, and they are disposed in the second section 12 on the edge of the driving backplane 1, that is, they are located at the edge of the peripheral region S2, and each detection pad 2 is distributed along the extension track of the second section 12. At the same time, the first section 11 on the edge of the driving backplane 1 is not disposed with the detection pads 2 to prevent the flexible circuit board 4 from contacting the detection pads 2 and cause a short circuit. In some embodiments of the present disclosure, the second short side, the first long side, and the second long side of the driving backplane 1 are all provided with the same number of detection pads 2 evenly distributed, while the first short side is not provided with the detection pads 2.

The detection pads 2 can be disposed on the surface of the driving backplane 1 for disposing the light emitting function layer 3, and can also be embedded in the surface, for example, on/in the surface of the third planarization layer 107 away from the substrate 101. Other film layers can be laminated on the detection pads 2 so that a film thickness tester can be used to detect the thickness of the film layer on the detection pad 2.

The shape of the detection pads 2 can be polygons such as rectangles, pentagons, hexagons, etc., and can also be circles or other shapes. Of course, the detection pads 2 may also be an irregular shape formed by cutting when a substrate is cut into multiple display panels, which is not specifically limited here. In addition, the shape and size of different detection pads 2 may be different.

As shown in FIGS. 4 and 5, the light emitting function layer 3 is disposed on the driving backplane 1 and located in the pixel driving region S1, that is, the projection of the light emitting function layer 3 on the driving backplane 1 is located within the pixel driving region S1. The light emitting function layer 3 includes a plurality of light emitting devices, each of which can be connected to a driving transistor 102 and can emit light independently.

In some embodiments of the present disclosure, as shown in FIGS. 4 and 5, the light emitting function layer 3 includes a first electrode 31, a pixel defining layer 32, a light emitting material layer 33, and a second electrode 34.

Where, the first electrode 31 serves as the anode of the light emitting device, and there are a plurality of first electrodes 31, and the plurality of first electrodes 31 are distributed on the driving backplane 1 in an array, for example, distributed on the surface of the third planarization layer 107 away from the substrate 101. The material of the first electrode 31 includes ITO (Indium Tin Oxide) or other transparent conductive materials. In some embodiments of the present disclosure, the detection pads 2 and the first electrodes 31 may be disposed in the same layer so as to be formed by the same patterning process. For example, before cutting the substrate to form multiple display panels, at least part of the detection pads 2 of two adjacent display panels are connected to each other and form an integrated conductive piece. The conductive piece and the first electrodes 31 can be disposed in the same layer to be formed by the same patterning process. Further, the shape and size of the conductive piece may be the same as the first electrodes 31, for example, the shape of the conductive piece and the first electrodes 31 are both rectangular, hexagonal, etc., so as to improve the uniformity of the film layer.

When cutting the substrate to form the display panel, each conductive piece can be cut into two symmetrical detection pads 2 from the middle position, of course, the cutting position is not necessarily located in the middle of the conductive piece, so that the shapes and sizes of the two detection pads 2 after cutting may be different.

The pixel defining layer 32 and the first electrode 31 are disposed on the same surface of the driving backplane 1 and have pixel opening exposing the first electrode 31.

The light emitting material layer 33 can cover the pixel defining layer 32 and cover the first electrode 31 in each pixel opening. The light emitting material layer 33 includes at least one light emitting unit layer, and each light emitting unit layer includes at least a hole transport layer, a light emitting layer, and an electron transport layer that are sequentially stacked in a direction away from the driving backplane 1. If the number of light emitting unit layer is multiple, two adjacent light emitting unit layers are connected by a charge generation layer.

In some embodiments of the present disclosure, the light emitting material layer 33 is only located in the pixel driving region S1, however, no light emitting material layer 33 is disposed in the peripheral region S2. For example, the light emitting material layer 33 can be vapor-deposited in the pixel driving region S1 through an open mask process, while the peripheral region S2 is not vapor-deposited, that is, the detection pads 2 are not covered by the light emitting material layer 33.

In addition, as shown in FIG. 5, the first electrode closest to the peripheral region S2, the light emitting material layer 33 at the boundary of the pixel driving region S1, and the peripheral region S2, can extend to the driving backplane 1, thereby the edge, which is near the peripheral region S2, of the first electrode 31 closest to the peripheral region S2 is wrapped. That is, all the first electrodes 31 are located within the projection of the light emitting material layer 33 on the driving backplane, and the edge of the light emitting material layer 33 extends to the driving backplane 1. However, the light emitting material layer 33 may not extend to the detection pads 2, that is, there may be a region between the detection pads 2 and the pixel driving region S1 that is not covered by the light emitting material layer 33.

The second electrode 34 is disposed on the surface of the light emitting material layer 33 away from the driving backplane 1, and the first electrode 31 corresponding to each pixel opening, the light emitting material layer 33, and the second electrode 34 can constitute a light emitting device, each driving transistor 102 of the pixel driving region S1 can be connected to the first electrode 31 in a one-to-one correspondence, so as to drive each light emitting device to emit light independently. The material of the second electrode 34 may include Mg/Ag alloy material or other materials.

In some embodiments of the present disclosure, the second electrode 34 is only located in the pixel driving region S1, and the second electrode 34 is not disposed in the peripheral region S2. For example, the second electrode 34 can be formed in the pixel driving region S1 through an open mask process, and the peripheral region S2 does not have the second electrode 34, that is, the detection pads 2 is not covered by the second electrode 34.

In other embodiments of the present disclosure, the second electrode 34 may extend to the peripheral region S2 and cover the surface of the light emitting material layer 33 extending toward the driving backplane 1, thereby extending to the driving backplane 1, covering the edge of the light emitting material layer 33.

As shown in FIGS. 4 and 5, the display panel may further include a first packaging layer 5. The first packaging layer 5 can be disposed on the side of the light emitting function layer 3 away from the driving backplane 1, and the orthographic projection of the first packaging layer 5 on the driving backplane 1 covers the pixel driving region S1 and the detection pads 2, thereby the uniformity of the film thickness of the first packaging layer 5 can be judged by detecting the film thickness of the first packaging layer 5 on each detection pad 2. In some embodiments of the present disclosure, the portion of the first packaging layer 5 in the peripheral region S2 may be laminated on the surface of the detection pad 2 facing away from the driving backplane 1 to detect the uniformity of the first packaging layer 5.

The first packaging layer 5 can be a single layer or a multi-layer structure.

If the first packaging layer 5 is a multi-layer structure and includes multiple sub-packaging layers, the film thickness can be tested after each sub-packaging layer is formed to determine the uniformity of each sub-packaging layer. The first packaging layer 5 can effectively block water vapor and oxygen, and achieve the purpose of protecting the light emitting device.

Specifically, after each sub-packaging layer of the first packaging layer 5 is formed, the film thickness of the sub-packaging layer on each detection pad 2 can be tested by a film thickness tester. Since the detection pads 2 are distributed in multiple positions, the film thickness of different regions of the sub-packaging layer can be reflected, and the uniformity of the film thickness of the sub-packaging layer can be determined according to the difference of the film thickness of the sub-packaging layer on different detection pads 2.

Further, since the above-mentioned light emitting material layer 33 is a continuous film layer, its light emitting color is a single color, that is, the light emitting color of each light emitting device is the same, for example, white light or light of other colors. In order to achieve color display, the display panel of this embodiment may further include a color film layer 7, which may be disposed on the side of the first packaging layer 5 away from the driving backplane 1 and corresponding to the pixel driving region S1. That is, the projection of the color film layer 7 on the driving backplane 1 is located in the pixel driving region S1. The color film layer 7 has filter regions of multiple colors. For example, the color film layer 7 includes a red R filter region, a green G filter region, and a blue B filter region. Each filter region and each light emitting device of the light emitting function layer 3 are disposed in a one-to-one correspondence, so as to emit light of different colors.

As shown in FIG. 5, in some embodiments of the present disclosure, the first packaging layer 5 also covers the region of the driving backplane 1 between the detection pad 2 and the pixel driving region S1. That is, the first packaging layer 5 extends along the surface of the second electrode 34 to the driving backplane 1, thereby encapsulating the edge of the second electrode 34, so that the first packaging layer 5 is a continuous film layer extending from the pixel driving region S1 to the detection pads 2 to improve the packaging effect.

As shown in FIG. 5, in some embodiments of the present disclosure, the projection of the color film layer 7 on the driving backplane 1 is located in the pixel driving region S1, and the distance L between the color film layer 7 and the detection pads 2 in a direction parallel to the driving backplane 1 is 150 μm-200 μm, for example, 150 μm, 170 μm, 200 μm, etc.

In other embodiments of the present disclosure, the light emitting material layer 33 may include a plurality of independent light emitting units, and each light emitting unit is filled in each pixel opening in a one-to-one correspondence. The second electrode 34 covers the light emitting material layer 33 and the pixel defining layer 32. The first electrode 31 corresponding to each pixel opening, the light emitting unit and the second electrode 34 constitute an independent light emitting device. At the same time, there are multiple color types of light emitting units, that is, different light emitting units can emit light in different colors. In this case, there is no need to provide the color film layer 7 described above.

As shown in FIG. 2 and FIG. 4, the flexible circuit board 4 can extend between the first section 11 and the pixel driving region S1, at least part of the region of the orthographic projection of the flexible circuit board 4 on the plane where the display panel is located is between the first section 11 and the pixel driving region S1, and the flexible circuit board 4 is bonded to the bonding pads 6, thereby a driving signal can be input to the driving backplane 1 to make the display panel emit light.

In some embodiments of the present disclosure, as shown in FIGS. 2 and 4, the flexible circuit board 4 has a bonding end 401, and the bonding end 401 is disposed with a plurality of conductive contact pieces 41, the number of which can be the same with the number of the bonding pads 6. The material of the conductive contact pieces 41 may include copper, copper alloy, and other metals. The conductive contact pieces 41 can be disposed side by side and spaced apart from each other.

The bonding end 401 of the flexible circuit board 4 is located between the first section 11 and the pixel driving region S1, and is attached to the surface of the driving backplane 1, and each conductive contact piece 41 covers each bonding hole 100 in a one-to-one correspondence, and is connected to the corresponding bonding pad 6 through the conductive material 200.

In order to ensure the stability of the electrical connection between the flexible circuit board 4 and the bonding pads 6, the area of the region where the conductive contact pieces 41 and the bonding pads 6 are connected can be not less than 80% of the area of the conductive contact pieces 41. That is, the area of the overlapping region of the bonding hole 100 and the conductive contact piece 41 is greater than or equal to 80% of the region of the conductive contact piece 41, and the region of the conductive contact piece 41 is the region of the orthographic projection thereof on the flexible circuit board 4.

In addition, the flexible circuit board 4 further has a driving end 402 and a connecting portion 403, where the driving end 402 may include a driving chip, and the connecting portion 403 may be a flexible structure and connected between the driving end 402 and the bonding end 401.

In some embodiments of the present disclosure, as shown in FIGS. 4 and 5, the display panel may further include a second packaging layer 8 and a transparent cover plate 9.

The second packaging layer 8 can be disposed on the side of the color film layer 7 away from the driving backplane 1, and the orthographic projection of the second packaging layer 8 on the driving backplane 1 covers the pixel driving region S1 and the detection pads 2. That is, the second packaging layer 8 and the first packaging layer 5 may be stacked on the detection pads 2. The second packaging layer 8 may be a single layer or multi-layer structure, and its material is not limited to the same with the first packaging layer 5. When forming the second packaging layer 8, the film thickness of each second packaging layer 8 located on each detection pad 2 can be detected by a film thickness tester, so as to determine the uniformity of the second packaging layer 8. The specific method may be the same with the method of detecting the first packaging layer 5, and will not be described in detail here. The second packaging layer 8 can effectively block water vapor and oxygen, and achieve the purpose of protecting the light emitting device.

In some embodiments of the present disclosure, the portion of the second packaging layer 8 in the peripheral region S2 may be laminated on the surface of first packaging layer 5 covered the detection pad 2 away from the driving backplane 1, so as to detect the uniformity of the second packaging layer 8.

In addition, as shown in FIG. 5, the second packaging layer 8 also covers the region of the first packaging layer 5 between the detection pads 2 and the pixel driving region S1, and also covers the edge of the color film layer 7, so that the second packaging layer 8 is a continuous film layer extending from the pixel driving region S1 to the detection pads 2 to improve the packaging effect.

Of course, in some embodiments of the present disclosure, only one of the first packaging layer 5 and the second packaging layer 8 covers the region of the driving backplane 1 between the detection pad 2 and the pixel driving region S1.

The transparent cover plate 9 can be made from glass or other transparent materials, and it can be disposed on the surface of the second packaging layer 8 away from the driving backplane 1, covering at least the second packaging layer 8, and corresponding to the pixel driving region S1. That is, the projection of the transparent cover plate 9 on the driving backplane 1 covers the pixel driving region S1. Further, the transparent cover plate 9 is slightly smaller than the pixel driving region S1.

The embodiments of the present disclosure also provide a method for fabricating a display panel. For the structure of the display panel, refer to the structure of the display panel above, which will not be repeated here. The fabricating method may include step S110 to step S130 described as the follows.

Step S110, forming a substrate, which includes a plurality of display panels of any of the foregoing embodiments; at least one detection pad of each of the two adjacent display panels is connected to each other and forms an integrated structure.

Step S120, cutting the substrate and cutting off the detection pads to obtain a plurality of display panels;

Step S130, bonding the flexible circuit board to the bonding pads of the cut display module.

The beneficial effects of the fabricating method of the embodiments of the present disclosure can be referred to the above embodiments of the display panel, which will not be described in detail here.

Figure 7:
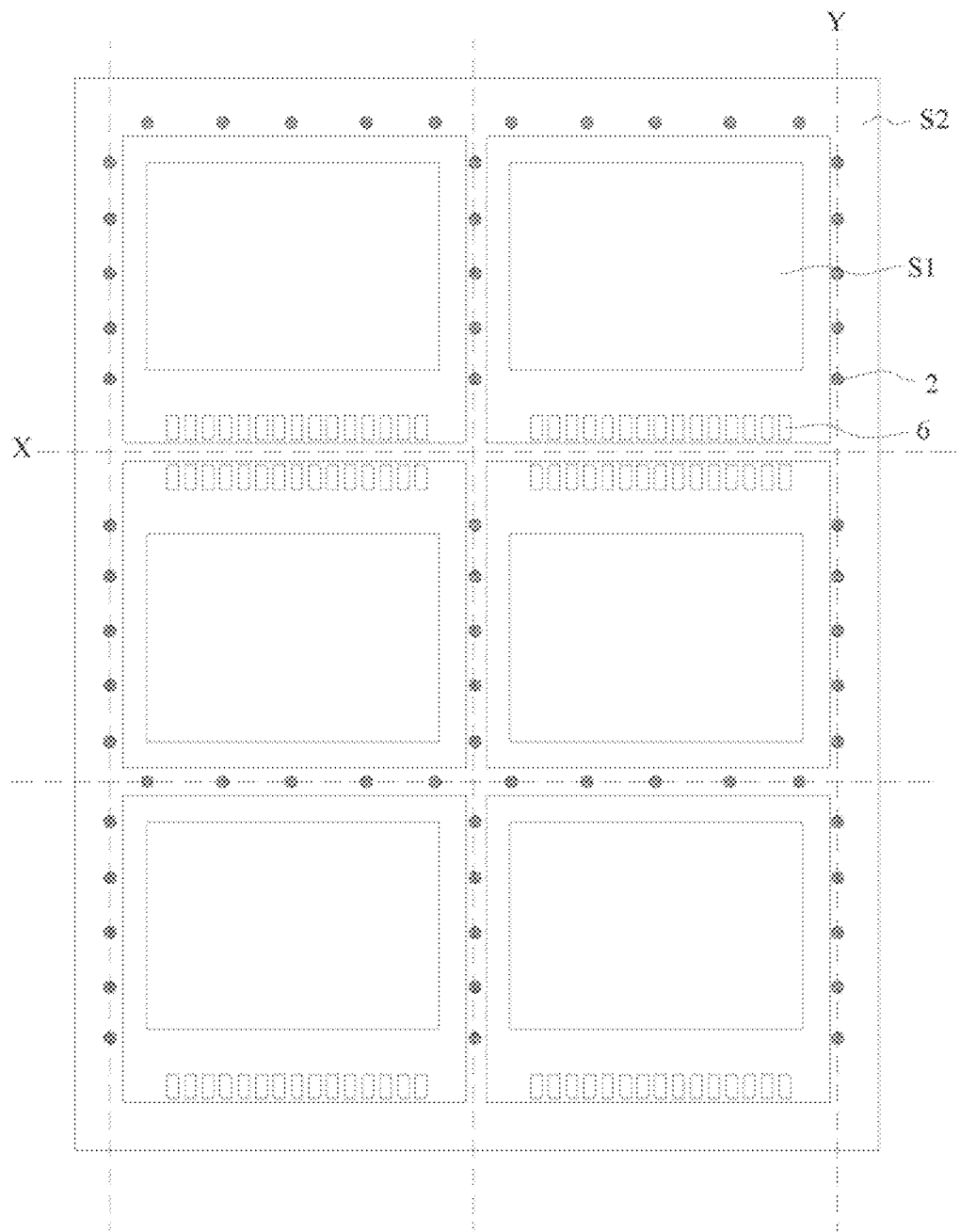
FIG. 7 is a top view of the substrate of the disclosure when it is not cut into display panels.

In step S110, as shown in FIG. 7, the substrate can be cut along the X line in the row direction and the Y line in the column direction, thereby cutting the substrate into multiple display panels, both X line and Y line pass through multiple detection pads, and after cutting, each detection pad can be divided into detection pads 2 belonging to two display panels. The cutting method may be laser cutting or other methods, which is not specifically limited here.

The embodiments of the present disclosure also provide a display device. The display device may include the display panel of any of the above-mentioned embodiments, and its specific structure is not described in detail here. The display device can be a mobile phone, a tablet computer, a TV, etc., which will not be listed here.

After considering the specification and practicing the disclosure herein, it will be easy for those skilled in the art to think of the other implementations of the disclosure. The application intends to cover any variants, usage, or changes of adaptation of the present disclosure. These variants, usage or changes of adaptation follow the general principles of the present disclosure, and include common sense or common technical means in the technical field not disclosed by the disclosure. The specification and embodiments are only exemplary, and the scope and spirit of the present disclosure are defined by the appended claims.

What is claimed is:

1. A display panel, comprising:
   a driving backplane having a pixel driving region and a peripheral region surrounding the pixel driving region, the peripheral region being provided with bonding pads, an edge of the driving backplane being surrounded by a first section and a second section, and the bonding pads being located between the first section and the pixel driving region;
   a plurality of detection pads disposed in the second section and distributed along the second section;
   a light emitting function layer disposed on the driving backplane and located in the pixel driving region;
   a flexible circuit board extending between the first section and the pixel driving region, and being bonded to the bonding pads;
   a first packaging layer disposed on a side of the light emitting function layer away from the driving backplane; and
   an orthographic projection of the first packaging layer on the driving backplane covers the pixel driving region and the detection pads.

2. The display panel according to claim 1, wherein the driving backplane has bonding holes exposing the bonding pads, and the flexible circuit board is bonded to the bonding pads through conductive material filled in the bonding holes.

3. The display panel according to claim 2, wherein the driving backplane comprises:
   a substrate;
   a driving transistor disposed on one side of the substrate and located in the pixel driving region;
   multi-layer wiring layers sequentially spaced and distributed on a side of the driving transistor away from the substrate along a direction away from the substrate;
   wherein at least one of the wiring layers is connected to the light emitting function layer, and each of a gate, a first pole, and a second pole of the driving transistor is connected to at least one of the wiring layers.

4. The display panel according to claim 3, wherein the wiring layers comprise a first wiring layer and a second wiring layer; the driving backplane further comprises:
   a first planarization layer, covering the driving transistor; the first wiring layer is disposed on a surface of the first planarization layer away from the substrate and connected to the driving transistor;
   a second planarization layer, covering the first wiring layer; the second wiring layer is disposed on a side of the second planarization layer away from the substrate and connected to the first wiring layer;
   a third planarization layer, covering the second wiring layer, and the light emitting function layer is disposed on a surface of the third planarization layer away from the substrate and connected to the second wiring layer;
   the bonding pads and the first wiring layer are disposed in the same layer, and the bonding holes are configured to penetrate the third planarization layer and the second planarization layer.

5. The display panel according to claim 4, wherein the driving transistor comprises:
   an active layer disposed in the substrate, the first pole and the second pole are spaced in the active layer; and
   a gate insulating layer disposed on the active layer and exposing the first pole and the second pole;
   wherein the gate is disposed on a surface of the gate insulating layer away from the active layer; and
   wherein the first pole, the second pole, and the gate are connected to the first wiring layer.

6. The display panel according to claim 2, wherein:
   the flexible circuit board has a plurality of conductive contact pieces disposed side by side at intervals;
   numbers of the bonding pads and the bonding holes are the same and both are multiple;
   each of the bonding pads is exposed from each of the bonding holes in a one-to-one correspondence; and
   each of the conductive contact pieces covers each of the bonding holes in a one-to-one correspondence, and is connected to the bonding pads through the conductive material.

7. The display panel according to claim 6, wherein an area of a region of the conductive contact pieces for connecting with the bonding pads is not less than 80% of an area of the conductive contact pieces.

8. The display panel according to claim 2, wherein an aperture of the bonding holes gradually decreases toward the bonding pads.

9. The display panel according to claim 8, wherein an acute angle formed by a sidewall of the bonding holes and a surface of the bonding pads is not less than 40° and not more than 70°.

10. The display panel according to claim 1, wherein the light emitting function layer comprises:
    a first electrode disposed on the driving backplane; the detection pads and the first electrode are disposed in the same layer;
    a light emitting material layer disposed on a side of the first electrode away from the driving backplane; and
    a second electrode disposed on a side of the light emitting material layer away from the driving backplane.

11. The display panel according to claim 1, wherein the driving backplane is in a shape of rectangle, the first section is one side of the rectangle, and the second section includes other sides of the rectangle.

12. The display panel according to claim 11, wherein edges of the driving backplane include a first short side, a second short side, a first long side and a second long side, the first short side and the second short side are opposite, the first long side and the second long side are opposite, the first section is the first short side, and the second section includes the second short side, the first long side, and the second long side; the second short side, the first long side and the second long side are all provided with a same number of detection pads.

13. The display panel according to claim 1, wherein the display panel further comprises:
- a color film layer disposed on a side of the first packaging layer away from the driving backplane and corresponding to the pixel driving region;
- a second packaging layer disposed on a side of the color film layer away from the driving backplane, and an orthographic projection of the second packaging layer on the driving backplane covers the pixel driving region, the peripheral region, and the detection pads;
- a transparent cover plate covering at least the second packaging layer and corresponding to the pixel driving region.

14. The display panel according to claim 13, wherein the first packaging layer and the second packaging layer are sequentially laminated on surfaces of the detection pads away from the driving backplane in regions corresponding to the detection pads.

15. The display panel according to claim 13, wherein a projection of the color film layer on the driving backplane is located in the pixel driving region, and a distance between the color film layer and the detection pads in a direction parallel to the driving backplane is 150 µm to 200 µm.

16. A display device, comprising:
- a driving backplane having a pixel driving region and a peripheral region surrounding the pixel driving region, and the peripheral region being provided with bonding pads;
- an edge of the driving backplane being surrounded by a first section and a second section, and the bonding pads being located between the first section and the pixel driving region;
- a plurality of detection pads being disposed in the second section and distributed along the second section;
- a light emitting function layer being disposed on the driving backplane and located in the pixel driving region;
- a flexible circuit board extending between the first section and the pixel driving region, and being bonded to the bonding pads;
- a first packaging layer being disposed on a side of the light emitting function layer away from the driving backplane, and an orthographic projection of the first packaging layer on the driving backplane covers the pixel driving region and the detection pads.

17. The display device according to claim 16, wherein the driving backplane has bonding holes exposing the bonding pads, and the flexible circuit board is bonded to the bonding pads through conductive material filled in the bonding holes.

18. The display device according to claim 17, wherein the driving backplane comprises:
- a substrate;
- a driving transistor disposed on one side of the substrate and located in the pixel driving region; and
- multi-layer wiring layers sequentially spaced and distributed on a side of the driving transistor away from the substrate along a direction away from the substrate;
- wherein at least one of the wiring layers is connected to the light emitting function layer, and
- wherein each of a gate, a first pole, and a second pole of the driving transistor is connected to at least one of the wiring layers.

19. The display device according to claim 18, wherein:
- the wiring layers comprise a first wiring layer and a second wiring layer; and
- the driving backplane further comprises:
- a first planarization layer covering the driving transistor, the first wiring layer being disposed on a surface of the first planarization layer away from the substrate and connected to the driving transistor;
- a second planarization layer covering the first wiring layer, the second wiring layer being disposed on a side of the second planarization layer away from the substrate and connected to the first wiring layer;
- a third planarization layer covering the second wiring layer, the light emitting function layer being disposed on a surface of the third planarization layer away from the substrate and connected to the second wiring layer; and
- the bonding pads and the first wiring layer are disposed in the same layer, and the bonding holes are configured to penetrate the third planarization layer and the second planarization layer.

20. The display device according to claim 19, wherein:
- the driving transistor comprises: an active layer disposed in the substrate, the first pole and the second pole are disposed in the active layer at intervals; and a gate insulating layer disposed on the active layer and exposing the first pole and the second pole;
- wherein the gate is disposed on a surface of the gate insulating layer away from the active layer; and the first pole, the second pole, and the gate are connected to the first wiring layer.

* * * * *